(12) United States Patent
Lee (10) Patent No.: US 10,340,396 B2
(45) Date of Patent: Jul. 2, 2019

(54) METHOD FOR MANUFACTURING SOLAR CELL

(71) Applicant: LG ELECTRONICS INC., Seoul (KR)

(72) Inventor: Eunjoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 4 days.

(21) Appl. No.: 15/857,242

(22) Filed: Dec. 28, 2017

(65) Prior Publication Data

US 2018/0198002 A1    Jul. 12, 2018

(30) Foreign Application Priority Data

Jan. 6, 2017    (KR) .................. 10-2017-0002285

(51) Int. Cl.
| | | |
|---|---|---|
| *H01L 21/00* | (2006.01) | |
| *H01L 31/02* | (2006.01) | |
| *H01L 31/18* | (2006.01) | |
| *H01L 21/02* | (2006.01) | |

(52) U.S. Cl.
CPC .. *H01L 31/02021* (2013.01); *H01L 21/02104* (2013.01); *H01L 31/1868* (2013.01); *Y02E 10/50* (2013.01); *Y02P 70/521* (2015.11)

(58) Field of Classification Search
None
See application file for complete search history.

(56) References Cited

U.S. PATENT DOCUMENTS

2014/0360571 A1* 12/2014 Ji ................... H01L 31/022441
                                                                136/256
2016/0336468 A1* 11/2016 Chung .............. H01L 31/049

* cited by examiner

*Primary Examiner* — Reema Patel
(74) *Attorney, Agent, or Firm* — Birch, Stewart, Kolasch & Birch, LLP (57) ABSTRACT

Disclosed is a method for manufacturing a solar cell, the method including: forming a semiconductor layer on one surface of a semiconductor substrate; forming a mask layer including a first layer and a second layer sequentially on the semiconductor layer; texturing another surface of the semiconductor substrate using the mask layer as a mask; forming a patterned mask layer by forming an opening at the mask layer through a laser patterning using a laser; and forming a conductive region through a doping process of doping a portion of the semiconductor layer exposed through the opening with a dopant.

20 Claims, 8 Drawing Sheets

METHOD FOR MANUFACTURING SOLAR CELL

CROSS-REFERENCE TO RELATED APPLICATION

This application claims priority to and the benefit of Korean Patent Application No. 10-2017-0002285, filed in the Korean Intellectual Property Office on Jan. 6, 2017, the entire contents of which are incorporated herein by reference.

BACKGROUND OF THE INVENTION

Field of the Invention

Embodiments of the invention relate to a method for manufacturing a solar cell, and, more particularly, to a method for manufacturing a solar cell having an improved process.

Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

In such solar cells, various layers and electrodes may be fabricated according to a design. Efficiency of solar cell may be determined by the design of these various layers and electrodes. In order to commercialize solar cells, it is required to overcome low efficiency and low productivity, and various layers and electrodes are required to be designed and manufactured so as to maximize the efficiency and the productivity of the solar cell.

SUMMARY OF THE INVENTION

Therefore, embodiments of the invention have been made in view of the above problems, and embodiments of the invention are to provide a method for manufacturing a solar cell being able to enhancing productivity of a solar cell having excellent efficiency.

A method for manufacturing a solar cell according to an embodiment of the invention includes: forming a semiconductor layer on one surface of a semiconductor substrate; forming a mask layer including a first layer and a second layer sequentially on the semiconductor layer; texturing another surface of the semiconductor substrate using the mask layer as a mask; forming a patterned mask layer by forming an opening at the mask layer through a laser patterning using a laser; and forming a conductive region through a doping process of doping a portion of the semiconductor layer exposed through the opening with a dopant.

According to embodiments of the invention, a mask layer including a first layer and a second layer having different materials or different compositions is used, and thus, the mask layer can perform various roles in a method for manufacturing a solar cell. More particularly, a laser patterning property can be improved by the first layer, and a semiconductor layer can be stably protected in the texturing process and doping can be performed at a desired portion in a doping process by the second layer. Further, a manufacturing process time of for the mask layer can be reduced. Thus, productivity of the solar cell having excellent efficiency can be improved.

DETAILED DESCRIPTION OF THE EMBODIMENTS

Hereinafter, embodiments of the invention will be described in detail with reference to accompanying drawings. However, embodiments of the invention are not limited thereto, and may be modified to other various embodiments.

In the drawings, illustration of portions unrelated to descriptions is omitted for clarity and simplicity. The same reference numerals designate the same or very similar elements throughout the specification. In the drawings, thicknesses, widths or the like of elements are exaggerated or reduced for clarity of descriptions, and thus, embodiments of the invention are not limited to the thickness, widths, or the like.

It will be understood that terms "comprise" and/or "comprising," or "include" and/or "including" used in the specification do not preclude a presence or addition of one or more other elements. In addition, it will be understood that, when an element such as a layer, film, region, or plate is referred to as being "on" another element, it may be disposed "directly on" another element or may be disposed such that an intervening element is also present therebetween. Accordingly, when an element such as a layer, film, region, or plate is disposed "directly on" another element, this means that there is no intervening element between the elements.

Hereinafter, a method for manufacturing a solar cell according to an embodiment of the invention will be described in detail with reference to the accompanying drawings. Hereinafter, an example of a solar cell manufactured by a method for manufacturing a solar cell according to an embodiment of the invention will be described in detail with reference to FIGS. 1 and 2, and then, a method for manufacturing a solar cell according to an embodiment of the invention will be described.

Figure 1:
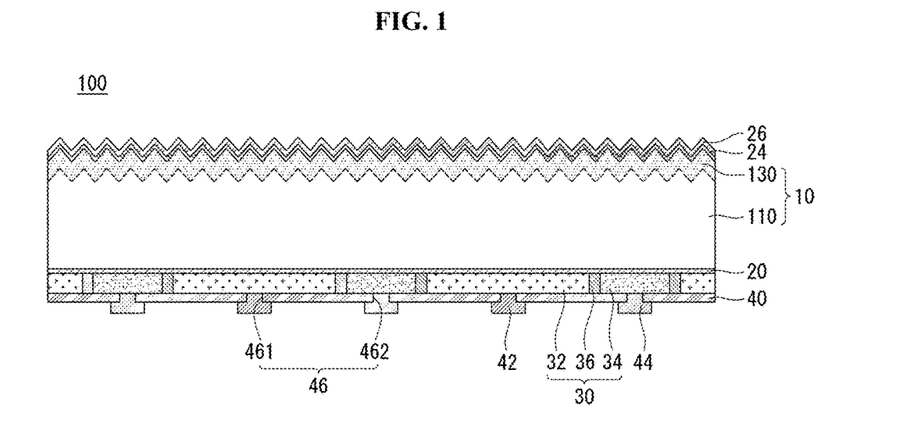
FIG. 1 is a cross-sectional view showing an example of a solar cell manufactured by a method for manufacturing a solar cell according to an embodiment of the invention.
Figure 2:
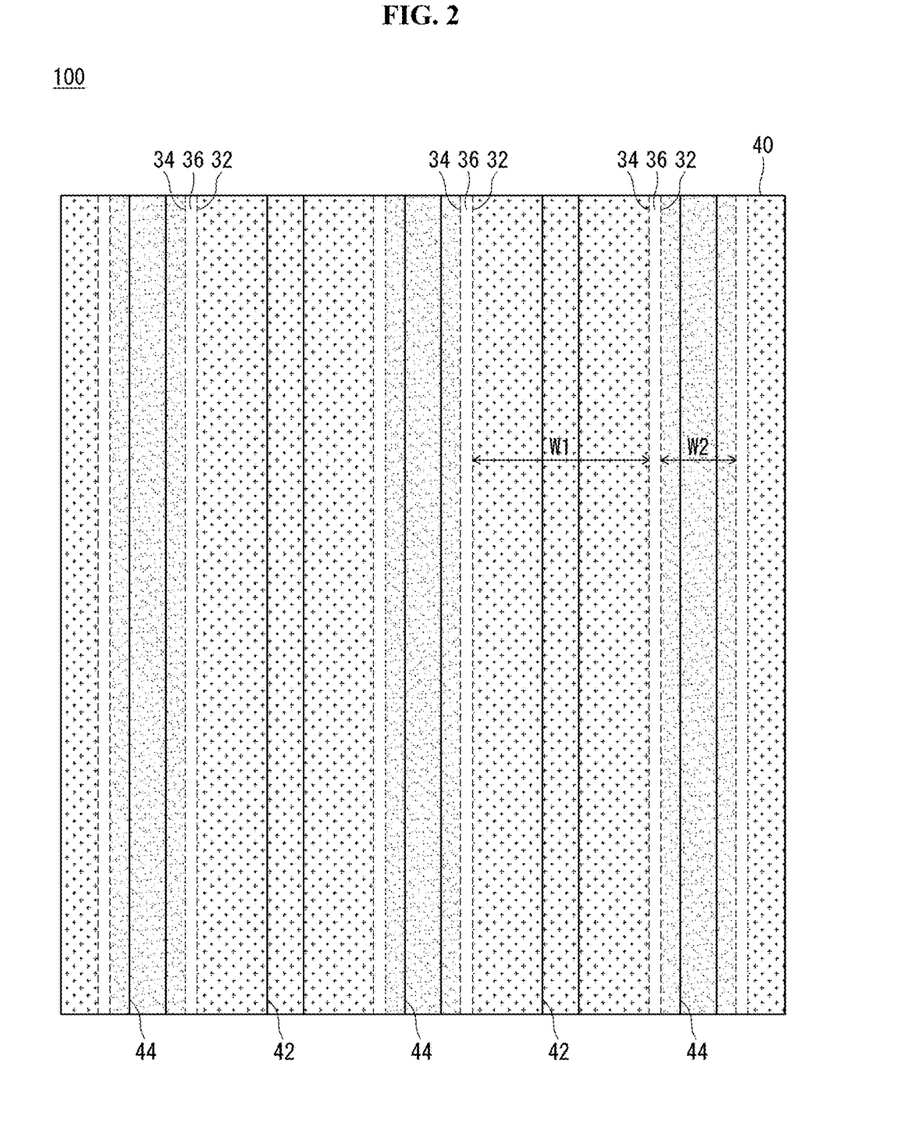
FIG. 2 is a partial rear plan view of the solar cell shown in FIG. 1.

FIG. 1 is a cross-sectional view showing an example of a solar cell manufactured by a method for manufacturing a solar cell according to an embodiment of the invention, and FIG. 2 is a partial rear plan view of the solar cell shown in FIG. 1.

Referring to FIGS. 1 and 2, a solar cell 100 according to an embodiment of the invention includes a semiconductor substrate 10, a dopant control passivation layer (or an oxide layer) (hereinafter referred to as "control passivation layer") 20 on a surface (hereinafter referred to as "back surface") of the semiconductor substrate 10, conductive regions 32 and 34 on the control passivation layer 20, and electrodes 42 and 44 electrically connected to the conductive regions 32 and 34. The conductive regions 32 and 34 include a first conductive region 32 having a first conductivity type and a second conductive region 34 having a second conductivity type that are positioned on the control passivation layer 20. The electrodes 42 and 44 include first electrodes 42 electrically connected to the first conductive regions 32 and second electrodes 44 electrically connected to the second conductive regions 34. In addition, the solar cell 100 may further include a front passivation layer 24 and an anti-reflection layer 26 formed on the other surface (hereinafter referred to as "front surface") of the semiconductor substrate 10, and a back passivation layer 40 formed on a semiconductor layer 30 including the conductive regions 32 and 34, or so on. This will be described in more detail.

The semiconductor substrate 10 may include a base region 110 including a second conductivity type dopant (e.g., a main dopant) to have a second conductivity type at a relatively low doping concentration. The base region 110 may be formed of a crystalline semiconductor (e.g., a single-crystalline or a poly-crystalline semiconductor, e.g., single-crystalline or poly-crystalline silicon, particularly, single-crystalline silicon) including a second conductivity type dopant. The solar cell 100 based on the semiconductor substrate 10 or the base region 110 having a high degree of crystallinity and having few defects is excellent in electrical properties.

The second conductivity type may be a p-type or an n-type. For example, when the base region 110 is an n-type, the first conductive region 32 of a p-type that forms a junction (for example, a pn junction while interposing the control passivation layer 20), which generates carriers by a photoelectric conversion, with the base region 110 can be formed with a large area, and thus, a photoelectric conversion area can be increased. Also, the first conductive region 32 having a large area can effectively collect holes having a relatively slow moving speed, thereby contributing to an improvement of the photoelectric conversion efficiency. However, embodiments of the invention are not limited thereto.

In the embodiment, the front surface field region 130 positioned on or at the front surface of the semiconductor substrate 10 may be formed of a doped region having a second conductivity type the same as the base area 110 and doping with a doping concentration higher than that of the base area 110. The doped region may constitute a part of the semiconductor substrate 10.

An anti-reflection structure for minimizing a reflection may be formed at the front surface of the semiconductor substrate 10 where the front surface field region 130 is positioned. For example, a texturing structure having a concave/convex shape or unevenness in a form of a pyramid or the like may be provided as an anti-reflection structure. The texturing structure formed at the semiconductor substrate 10 may have a certain shape (e.g., a pyramid shape) having an outer surface formed along a specific crystal plane (e.g., (111) plane) of a semiconductor. When a surface roughness of the semiconductor substrate 10 is increased by the concave/convex structure on the front surface of the semiconductor substrate 10 formed by the texturing, a reflectance of light incident through the front surface of the semiconductor substrate 10 can be reduced to minimize an optical loss.

The back surface of the semiconductor substrate 10 may be formed of a relatively smooth and flat surface having a surface roughness smaller than that of the front surface by a mirror-polishing or the like. When the first and second conductive regions 32 and 34 are formed together on the back surface of the semiconductor substrate 10 as in the embodiment, properties of the solar cell 100 may be greatly varied according to properties of the back surface of the semiconductor substrate 10. As a result, the unevenness due to the texturing is not formed at the back surface of the semiconductor substrate 10, and thus, a passivation property of at the back surface of the semiconductor substrate 10 can be improved, thereby improving the properties of the solar cell 100. However, the unevenness due to the texturing may be formed at the back surface of the semiconductor substrate 10 in some embodiments. Various other variations are possible.

The control passivation layer 20 may be formed on the back surface of the semiconductor substrate 10. For example, the control passivation layer 20 may be entirely formed on the back surface of the semiconductor substrate 10 and be in contact with the back surface of the semiconductor substrate 10. Then, the control passivation layer 20 can be easily formed without a patterning, a structure thereof can be simplified, and carriers can be stably transferred.

In the embodiment, the control passivation layer 20 positioned between the semiconductor substrate 10 and the conductive regions 32 and 34 acts as a dopant controller or a diffusion barrier that prevents the dopants of the conductive regions 32 and 34 from being excessively diffused into the semiconductor substrate 10. The control passivation layer 20 may include any of various materials capable of controlling the dopants and capable of transporting majority carriers. For example, the control passivation layer 20 may include an oxide, a nitride, a semiconductor, a conductive polymer, or the like. For example, the control passivation layer 20 may be an oxide layer, and, more particular, a silicon oxide layer including a silicon oxide. The silicon oxide layer has an excellent passivation property and carriers are smoothly transferred through the silicon oxide layer.

The control passivation layer 20 may have a small thickness so that carriers can be stably transferred. For example, a thickness of the control passivation layer 20 may be 5 nm or less (more particularly, 2 nm or less, for example, 0.5 nm to 2 nm). If the thickness of the control passivation layer 20 is more than 5 nm, the carriers may be not transferred and the solar cell 100 may not operate. If the thickness of the control passivation layer 20 is less than 0.5 nm, the control passivation layer 20 having a desired quality may be difficult to be formed. The thickness of the control passivation layer 20 may be 2 nm or less (more particularly, 0.5 nm to 2 nm) so that the carriers can be smoothly transferred more. In this instance, the thickness of the control passivation layer 20 may be 0.5 nm to 1.5 nm. However, embodiments of the invention are not limited thereto, and the thickness of the control passivation layer 20 may have any of various values.

The semiconductor layer 30 including the conductive regions 32 and 34 may be positioned on the control passivation layer 20. In one example, the semiconductor layer 30 may be in contact with the control passivation layer 20 to simplify a structure and allow carriers to be easily transferred.

In the embodiment, the semiconductor layer 30 includes the first conductive region 32 having a first conductivity type dopant to have a first conductivity type, and the second conductive region 34 having a second conductivity type dopant to have a second conductivity type. The first conductive region 32 and the second conductive region 34 may be positioned together at or in the semiconductor layer 30 continuously formed on the control passivation layer 20, and thus, may be coplanar or positioned on the same plane. A barrier region 36 may be positioned between the first conductive region 32 and the second conductive region 34.

The first conductive region 32 may constitute an emitter region forming a pn junction (or a pn tunnel junction) with the base region 110, which interposes the control passivation layer 20 between the first conductive region 32 and the base region 110, to generate carriers by a photoelectric conversion. The second conductive region 34 may constitute a back surface field region for generating a back surface field to prevent carriers from being lost due to a recombination at the back surface of the semiconductor substrate 10.

In this instance, the first conductive region 32 may include a semiconductor (for example, silicon) including a first conductivity type dopant to have a conductivity type opposite to that of the base region 110. The second conductive region 34 may include a second conductivity type dopant to have a conductivity type the same as that of the base region 110, and a doping concentration of the second conductive region 34 may be higher than that of the base region 110. In the embodiment, the first and second conductive regions 32 and 34 may be formed of a semiconductor layer, which is formed on the semiconductor substrate 10 (more particularly, on the control passivation layer 20) to be separated from the semiconductor substrate 10 and is doped with the first or second conductivity type dopant. Accordingly, the first and second conductive regions 32 and 34 may be formed of a semiconductor layer having a crystal structure different from that of the semiconductor substrate 10 so that the first and second conductive regions 32 and 34 can be easily formed on the semiconductor substrate 10. For example, the first and second conductive regions 32 and 34 may be formed by doping an amorphous semiconductor, a micro-crystalline semiconductor, or a poly-crystalline semiconductor (e.g., amorphous silicon, micro-crystalline silicon, or poly-crystalline silicon) or the like, which can be easily manufactured by any of various methods, such as, a deposition, with a first or second conductivity type dopant. In particular, when the first and second conductive regions 32 and 34 include a poly-crystalline semiconductor, a carrier mobility can be high. The first or second conductivity type dopant may be doped during a process of forming the semiconductor layer 30 to be included in the semiconductor layer 30 or may be doped by any of various doping methods, such as, a thermal diffusion method, an ion implantation method, or the like, after forming the semiconductor layer 30.

Any of various materials, which may be doped to the semiconductor layer 30 to exhibit an n-type or a p-type, may be used for the first or second conductivity type dopant. When the first or second conductivity type dopant is a p-type, a group III element, such as, boron (B), aluminum (Al), gallium (Ga), indium (In) or so on, may be used. When the first or second conductivity type dopant is an n-type, a group V element, such as, phosphorus (P), arsenic (As), bismuth (Bi), antimony (Sb) or so on, may be used. In one example, one of the first and second conductivity type dopants may be boron (B) and the other of the first and second conductivity type dopants may be phosphorus (P).

The barrier region 36 may be positioned between the first conductive region 32 and the second conductive region 34 to separate the first conductive region 32 and the second conductive region 34 each other. If the first conductive region 32 and the second conductive region 34 are in contact with each other, a shunt may occur, thereby deteriorating a performance of the solar cell 100. Accordingly, in the embodiment, an unnecessary shunt can be prevented by positioning the barrier region 36 between the first conductive region 32 and the second conductive region 34.

An insulating material, which is not doped, (i.e., an undoped insulating material) (e.g., an oxide, a nitride) or so on may be used for the barrier region 36. Alternatively, the barrier region 36 may include an intrinsic semiconductor. In this instance, the first conductive region 32, the second conductive region 34, and the barrier region 36 are formed of the same semiconductor layer (for example, an amorphous silicon layer, a micro-crystalline silicon layer, a poly-crystalline silicon layer), which is continuously formed so that side surfaces of them are in contact with each other. The barrier region 36 may be formed of an i-type (intrinsic) semiconductor material that substantially does not include dopants. For example, a semiconductor layer including a semiconductor material may be formed, and then, a first conductivity type dopant may be doped to a portion of the semiconductor layer to form a first conductive region 32 and a second conductivity type dopant may be doped another portion of the semiconductor layer. Then, a region where the first conductive region 32 and the second conductive region 34 are not formed may constitute the barrier region 36. In this instance, a manufacturing method for the first conductive region 32, the second conductive region 34, and the barrier region 36 can be simplified.

However, embodiments of the invention are not limited thereto. Accordingly, the barrier region 36 may be formed by any of various methods and may have any of various thicknesses and any of various shapes. The barrier region 36 may be a trench of an empty space. Various other variations are possible. In the drawing, it is exemplified that the barrier region 36 entirely separates the first conductive region 32 and the second conductive region 34. However, the barrier region 36 may be formed to separate only a part of a boundary portion of the first conductive region 32 and the second conductive region 34. Alternatively, since the barrier region 36 is not formed, and a boundary of the first conductive region 32 and the second conductive region 34 may be in contact with each other.

The back passivation layer 40 may be formed on the first and second conductive regions 32 and 34 and the barrier region 36 at the back surface of the semiconductor substrate 10. For example, the back passivation layer 40 may be in contact with the first and second conductive regions 32 and 34 and the barrier region 36 to simplify a structure of the solar cell 100.

The back passivation layer 40 has contact holes 46 for electrically connecting the conductive regions 32 and 34 to the electrodes 42 and 42. The contact hole 46 includes first contact holes 461 for connecting the first conductive region 32 and the first electrode 42 and second contact holes 462 for connecting the second conductive region 34 and the second electrode 44. As a result, the back passivation layer 40 may prevent the first conductive region 32 and the second conductive region 34 from being connected to an electrode not to be connected (that is, the second electrode 44 in a case of the first conductive region 32, and the first electrode in a case of the second conductive region 34). In addition, the back passivation layer 40 may passivate the first and second conductive regions 32 and 34 and/or the barrier region 36.

The front passivation layer 24 and/or the anti-reflection layer 26 is formed on the front surface of the semiconductor substrate 10 (more particularly, on the front surface field region 130 formed at the front surface of the semiconductor substrate 10). However, embodiments of the invention are not limited thereto, and another insulating layer having a different stacked structure may be formed on the front surface field region 130.

The front passivation layer 24 and the anti-reflection layer 26 may be formed on a substantially entire portion of the front surface of the semiconductor substrate 10. The back passivation layer 40 may be formed entirely on the back surface of the semiconductor layer 30 except for the contact hole 46.

The front passivation layer 24 or the back passivation layer 40 may be contact with the semiconductor substrate 10 or the semiconductor layer 30 to passivate a surface or a bulk of the semiconductor substrate 10 or the semiconductor layer 30. Accordingly, recombination sites of minority carriers can be removed, and open-circuit voltage of the solar cell 100 can be enhanced. The anti-reflection layer 26 can reduce a reflectance of light incident to the front surface of the semiconductor substrate 10 and can increase an amount of light reaching the pn junction. Accordingly, short circuit current Isc of the solar cell 100 can be increased.

The front passivation layer 24, the anti-reflection layer 26, and the back passivation layer 40 may be formed of any of various materials. For example, the front passivation layer 24, the anti-reflection layer 26, or the passivation layer 40 may be formed of a single layer or have a multilayer structure having at least two layers, which includes at least one selected from a group consisting of a silicon nitride layer, a silicon nitride layer including hydrogen, a silicon oxide layer, a silicon oxynitride layer, an aluminum oxide layer, a silicon carbide layer, $MgF_2$, ZnS, $TiO_2$, and $CeO_2$.

For example, in the embodiment, the front passivation layer 24 and/or the anti-reflection layer 26, and the back passivation layer 40 may not have a dopant or the like in order to have good insulating and passivation properties. However, embodiments of the invention are not limited thereto.

The front passivation layer 24, the anti-reflection layer 26, and the back passivation layer 40 may have thicknesses greater than a thickness of the control passivation layer 20. Thus, insulating and passivation properties can be improved. Various other variations are possible.

The first electrode 42 may fill at least a part of the first contact hole 461 of the back passivation layer 40 to be electrically connected to (for example, to be in contact with) the first conductive region 32. The second electrode 44 may fill at least a part of the second contact hole 462 of the back passivation layer 40 to be electrically connected to (for example, to be in contact with) the second conductive region 34.

In the embodiment, the first conductive regions 32 and the second conductive regions 34 longitudinally extend to from a stripe shape, and are alternately arranged in a direction crossing a longitudinal direction thereof. The barrier region 36 may be positioned between the first conductive region 32 and the second conductive region 34 to separate them. Although not shown in the drawings, a plurality of first conductive regions 32 spaced apart from each other may be connected to each other at one edge, and a plurality of second conductive regions 34 spaced apart from each other may be connected to each other at the other edge. However, embodiments of the invention are not limited thereto.

In this instance, an area of the first conductive region 32 may be greater than an area of the second conductive region 34. For example, areas of the first conductive region 32 and the second conductive region 34 may be adjusted by varying their widths. That is, a width W1 of the first conductive region 32 may be greater than a width W2 of the second conductive region 34.

The first electrodes 42 are formed to have a stripe shape to correspond to the first conductive regions 32 and the second electrodes 44 are formed to have a stripe shape to correspond to the second conductive regions 34. The contact holes 46 may be formed such that a part of the first and second electrodes 42 and 44 are electrically connected to (for example, are in contact with) the first and second conductive regions 32 and 34, respectively. For example, a plurality of first contact holes 461 may be formed for each of the first conductive regions 32, and a plurality of second contact holes 462 may be formed for each of the second conductive regions 34. Alternatively, a contact hole 46 extending in an entire length to correspond to the first or second conductive regions 32 or 34. Then, a contact area between the first and second electrodes 42 and 44 and the first and second conductive regions 32 and 34 can be maximized, and thus, carrier collection efficiency can be enhanced. Various other variations are possible. Although not shown in the drawings, the first electrodes 42 may be connected to each other at one edge, and the second electrodes 44 may be connected to each other at the other edge. However, embodiments of the invention are not limited thereto.

For example, in the embodiment, the base region 110, the front surface field region 130, and the second conductive region 34 may have an n-type conductivity as the second conductivity type. When the base region 110 has an n-type, a lifetime of electrons, which are majority carriers, can be increased. As described above, the first conductive region 32 constituting the emitter region can effectively collect holes.

When light is incident to the solar cell 100 according to the embodiment, electrons and holes are generated by a photoelectric conversion, and the generated holes and electrons are transferred to the first conductive region 32 and the second conductive region 34 passing through the control passivation layer 20 and then are transferred to the first and second electrodes 42 and 44, respectively, thereby generating electrical energy.

In the solar cell 100 having the back contact structure in which the electrodes 42 and 44 are formed on the back surface of the semiconductor substrate 10 and the electrodes 42 and 44 are not formed on the front surface of the semiconductor substrate 10 as in the embodiment, a shading loss at the front surface of the substrate 10 can be minimized. Thus, efficiency of the solar cell 100 can be improved. Since the control passivation layer 20 is disposed between the first and second conductive regions 32 and 34 and the semiconductor substrate 10, the first and second conductive regions 32 and 34 are formed of a separate layer different from the semiconductor substrate 10. As a result, a loss due to a recombination can be minimized as compared with a case where a doped region formed by doping the semiconductor substrate 10 with the dopants is used as the conductive region.

Hereinafter, a method for manufacturing the solar cell 100 described above will be described in detail with reference to FIGS. 3A to 3K.

FIGS. 3A to 3K are views showing a method for manufacturing a solar cell according to an embodiment of the invention.

Figure 3A:
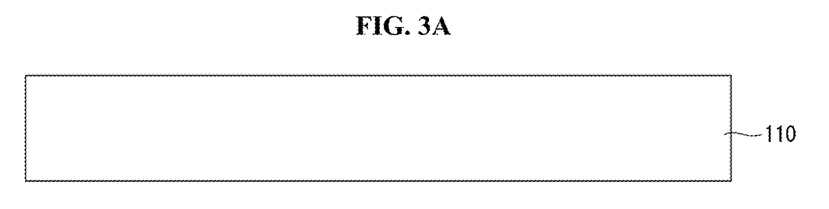
FIGS. 3A to 3K are views showing a method for manufacturing a solar cell according to an embodiment of the invention.

First, as shown in FIG. 3A, a semiconductor substrate 10 including a base region 110 having a second conductivity type dopant is prepared.

Figure 3B:
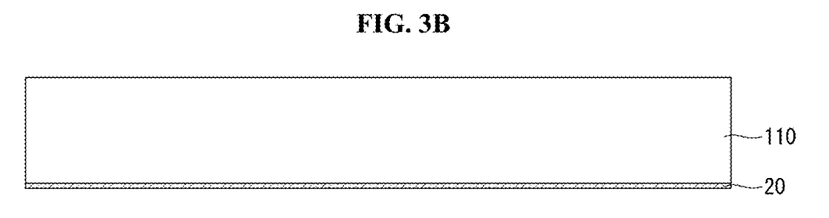

Next, as in shown in FIG. 3B, a control passivation layer 20 may be formed on the back surface of the semiconductor substrate 10. The control passivation layer 20 may be entirely formed on the back surface of the semiconductor substrate 10. In this instance, for example, a control passivation layer 20 may be formed by a thermal growth method, a deposition method (for example, a chemical vapor deposition (PECVD) method, an atomic layer deposition (ALD) method). However, embodiments of the invention are not limited thereto, and the control passivation layer 20 may be formed by any of various methods.

Next, as shown in FIGS. 3C to 3I, a first conductive region 32 and a second conductive region 34 may be formed on the control passivation layer 20, and a front surface field region 130 may be formed at or on a front surface of the semiconductor substrate 10. In this instance, an anti-reflection structure (for example, a texturing structure) may be formed at the front surface of the semiconductor substrate 10. This will be described in more detail as follows.

Figure 3C:
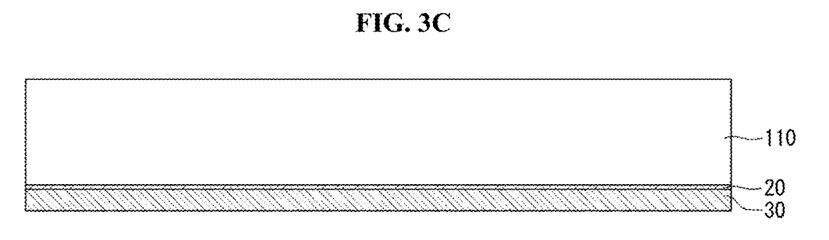

First, as shown in FIG. 3C, a semiconductor layer 30 being intrinsic is formed on the control passivation layer 20. The semiconductor layer 30 may be formed of a micro-crystalline, amorphous, or poly-crystalline semiconductor. The semiconductor layer 30 may be formed, for example, by a thermal growth method, a vapor deposition method (e.g., a low pressure chemical vapor deposition (LPCVD)) method), or the like. However, embodiments of the invention are not limited thereto, and the semiconductor layer 30 may be formed by any of various methods. In this instance, the semiconductor layer 30 may be formed of a poly-crystalline semiconductor having excellent crystallinity.

Although it is exemplified that the control passivation layer 20 and the semiconductor layer 30 are formed only on the back surface of the semiconductor substrate 10 in the drawings, embodiments of the invention are not limited thereto. The control passivation layer 20 and/or the semiconductor layer 30 may be additionally formed on the front surface and/or side surface of the semiconductor substrate 10 according to a manufacturing process. The control passivation layer 20 and/or the semiconductor layer 30 formed on the front surface or the like of the semiconductor substrate 10 may be removed later in a separate process (e.g., a texturing process, etc.).

Figure 3D:
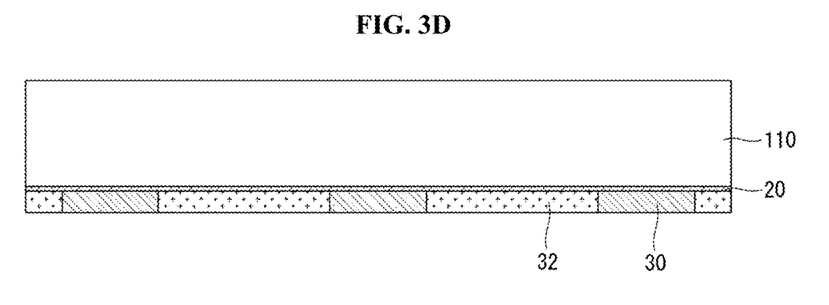

Next, as shown in FIG. 3D, a first conductivity type dopant is doped to a part of the semiconductor layer 30 to form a first conductive region 32. Any of various methods known as a doping process for forming the first conductive region 32 may be used. For example, various methods, such as, an ion implantation method, a thermal diffusion method performed by a heat treatment using a gas including a dopant, a heat treatment method performed after forming a doped layer, a laser doping method, or so on may be applied. In this instance, the first conductive region 32 may be doped by a different manufacturing process from the second conductive region 34. For example, the first conductive region 32 may be formed by a laser doping method where a dopant is formed and then a laser is irradiated thereto. Accordingly, the first conductive region 32 can be stably formed only at a part of the semiconductor layer 30 by a simple process.

Figure 3E:
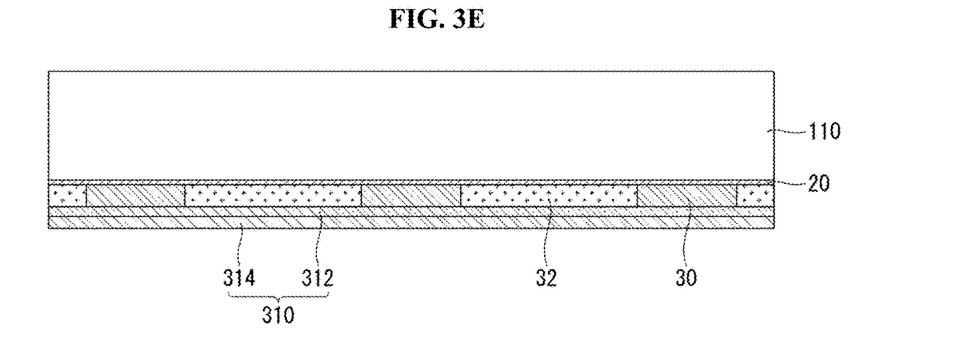

As shown in FIG. 3E, a mask layer 310 including a first layer 312 and a second layer 314 having different materials or different compositions is formed on the semiconductor layer 30. By the first layer 312 and the second layer 314 having different materials or different compositions as described above, various properties required for the mask layer 310 can be satisfied. In this instance, the mask layer 310 may be formed entirely on the semiconductor layer 30 and may does not have a pattern or may have a non-patterned shape.

In one example, the first layer 312 may include a material having a laser patterning property superior to (better than) that of the second layer 314, and the second layer 314 may include a material having a chemical resistance property (for example, an anti-alkali property) superior to (better than) that of the first layer 312. The second layer 314 may include a material having a dopant barrier property superior to (better than) that of the first layer 312.

Here, whether the laser patterning property is excellent or superior or not may be determined by checking whether the first layer 312 and the second layer 314 are patterned to have desired patterns or not after a laser patterning in which a portion of each of the first layer 312 and the second layer 314 is irradiated with a laser to remove the corresponding portion is performed. For example, when a scanning electron microscope (SEM) photograph is taken after the laser patterning, a portion that is removed by the laser pattering and a portion that is not removed by the laser pattering are different in brightness. Accordingly, it is possible to determine whether the laser patterning property is more excellent by checking whether a contrast ratio (or a difference in brightness) can be clearly recognized in a scanning electron microscope photograph, whether a pattern shape according to the contrast ratio has a desired pattern, or the like.

Whether the chemical resistance property is excellent or not may be determined by checking how much the first layer 312 and the second layer 314 are etched when the first layer 312 and the second layer 312 are in contact with chemical materials. In the embodiment, the mask layer 310 protects the semiconductor layer 30 positioned on the back surface of the semiconductor substrate 10 during the texturing process. The chemical resistance property (i.e., anti-alkali property) for a chemical material used in the texturing process (e.g., an alkaline solution, e.g., a potassium hydroxide (KOH) solution) of the second layer 314 may be superior to that of the first layer 312.

Whether the dopant barrier property is excellent or not may be determined by measuring and comparing doping concentrations of semiconductor layers doped through the first layer 312 and the second layer 314 after each of the first layer 312 and the second layer 314 formed on the semiconductor layers.

In this instance, each of the first layer 312 and the second layer 314 of the mask layer 310 may include silicon and carbon, but the first and second layers 312 and 314 may be formed of different materials or different compositions. Materials including silicon and carbon can have a dopant barrier property and a chemical resistance property superior to those of other materials. Furthermore, silicon carbide (SiC) formed of silicon and carbon can be excellent in a laser patterning property. That is, if a material not including silicon and carbon is used, an excellent laser patterning property, an excellent dopant barrier property, and an excellent chemical resistance property may be not achieved by adding different materials or changing compositions.

In one example, the first layer 312 may include silicon carbide (SiC) and the second layer 314 may include silicon oxycarbide (SiOC). The first layer 312 adjacent to the semiconductor layer 30 may include the silicon carbide with an excellent laser patterning property such that a portion of the mask layer 310 to which the laser is irradiated can be entirely removed after a laser patterning process. The second layer 314 positioned on an outer side of the mask layer 310 may include silicon oxycarbide having a dopant barrier property and a chemical resistance property superior to those of silicon carbide. Then, the semiconductor layer 30, the passivation layer 20, and the back surface of the semiconductor substrate 10 can be stably protected and the dopant can be prevented from diffusing at an undesirable portion by the second layer 314. In particular, the second layer 314 may further include oxygen along with silicon and carbon, and thus, is maintained as a layer including silicon and carbon. Alternatively, if nitrogen is further included in the second layer 314, the second layer 314 may be substantially converted to silicon nitride. The silicon nitride may not have an excellent dopant barrier property and an excellent chemical resistance property.

Alternatively, each of the first layer 312 and the second layer 314 may include silicon and carbon, and an oxygen content may be higher in the second layer 314 than in the first layer 312, based on an atomic percent or a weight percent. In this instance, a carbon content may be higher in the first layer 312 than in the second layer 314, based on an atomic percent or a weight percent The first layer 312 and the second layer 314 may be formed by any of various methods. In one example, the first layer 312 and the second layer 314 may be formed by a deposition method (e.g., a plasma enhanced chemical vapor deposition (PECVD) method). A process temperature may be 150 to 200° C., and gas atmosphere may be inert gas atmosphere (for example, argon (Ar) atmosphere). The, the mask layer 310 having the first layer 312 and the second layer 314 can be formed stably at a low temperature.

As described above, when each of the first layer 312 and the second layer 314 includes silicon and carbon in common, the first layer 312 and the second layer 314 may be formed by an in-situ process, that is, a continuous in the same apparatus. More particularly, the first layer 312 and the second layer 314 may be formed continuously by a deposition method in the same deposition apparatus by changing gases without being taken out to an outside of the deposition apparatus. According to this, the mask layer 310 including the first layer 312 and the second layer 314 having different materials or different compositions can be formed for a short process time by a simple process.

In this instance, the first layer 312 and the second layer 314 may be formed continuously in the same chamber in the same deposition apparatus or may be formed continuously in a plurality of chambers positioned in the same deposition apparatus. In the case of forming the first layer 312 and the second layer 314 in the same chamber, a structure of the deposition apparatus can be simplified. When chambers forming the first layer 312 and the chamber forming the second layer 314 are separated from each other in the deposition apparatus, the used gas atmosphere can be maintained and a purge process or so on is not required, thereby simplifying a process.

Here, a thickness of the second layer 314 may be the same as or greater than that of the first layer 312. In particular, the thickness of the second layer 314 may be greater than that of the first layer 312. The second layer 314 positioned at the outer surface of the mask layer 310 can effectively protect the semiconductor layer 30 and the like from chemical substances and effectively prevent a diffusion of the dopants. In addition, since a deposition rate of the second layer 314 is greater than a deposition rate of the first layer 312, a time of the deposition process of the mask layer 310 can be minimized by the relatively large thickness of the second layer 314.

In one example, the thickness of the first layer 312 may be 10 to 100 nm, and the thickness of the second layer 314 may be 90 to 150 nm. If the thickness of the first layer 312 is less than 10 nm, the first layer 312 may not be uniformly formed, and the second layer 314 may not be removed even if the first layer 312 is removed during a laser patterning. If the thickness of the first layer 312 exceeds 100 nm, a time of a manufacturing process may increase. If the thickness of the second layer 314 is less than 90 nm, an effect of the second layer 314 may not be sufficient. If the thickness of the second layer 314 exceeds 150 nm, a time of a manufacturing process may increase.

A refractive index of the first layer 312 may be 1.6 to 1.8, and a refractive index of the second layer 314 may be 1.5 to 1.7. Within the range, the laser patterning property of the first layer 312 may be excellent, and the dopant barrier property and the chemical resistance of the second layer 314 may be excellent. Although it is not clear, the refractive index varies depending on a material and a composition, and thus, it seems that the composition of silicon carbide and silicon oxycarbide having the corresponding refractive index can realize the desired properties in the embodiment.

However, embodiments of the invention are not limited to the thicknesses and the refractive indexes of the first layer 312 and the second layer 314 described above.

Figure 3F:
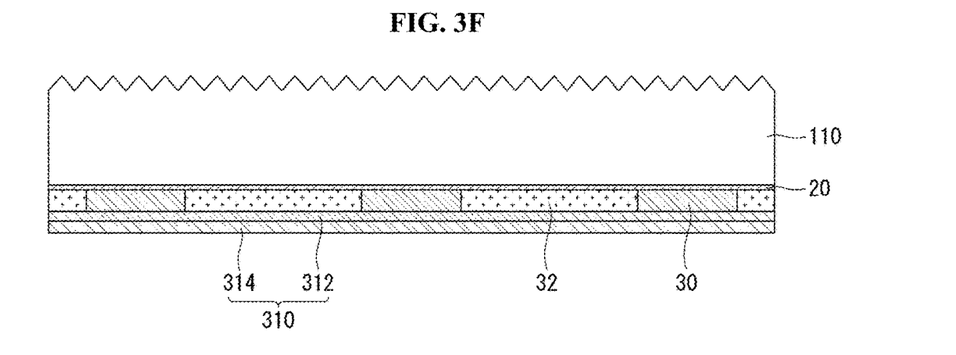

Next, as shown in FIG. 3F, a front surface of the semiconductor substrate 10 may be textured using the mask layer 310 as a mask. That is, the texturing is performed in a state that the undoped mask layer 310 covers an entire portion of the back surface of the semiconductor substrate 10. Thus, the back surface of the semiconductor substrate 10 is not textured and only the front surface of the semiconductor substrate 10 is textured. Since the second layer 314 positioned on the outer surface of the mask layer 310 has a chemical resistance property superior to that of the first layer 312, the semiconductor layer 30, the control passivation layer 20, and the back surface of the semiconductor substrate 10 can be effectively prevented from being undesirably textured.

A wet or dry texturing may be used for texturing a surface of the semiconductor substrate 10. A wet texturing may be performed by immersing the semiconductor substrate 10 in a texturing solution, and has a short process time. In a dry texturing, a surface of the semiconductor substrate 10 is cut or etched by using a diamond grill or a laser. In the drying texturing, unevenness can be uniformly formed, but a processing time is long and the semiconductor substrate 10 may be damaged. Alternatively, the semiconductor substrate 10 may be textured by a reactive ion etching (RIE) method or the like. As described above, the semiconductor substrate 10 may be textured in any of various ways.

As an example, in the embodiment, a wet texturing using an alkali solution (for example, a potassium hydroxide solution) may be performed. Accordingly, the texturing process can be performed by a simple process, and the semiconductor layer 30 and the like can be stably protected by the second layer 314.

Figure 3G:
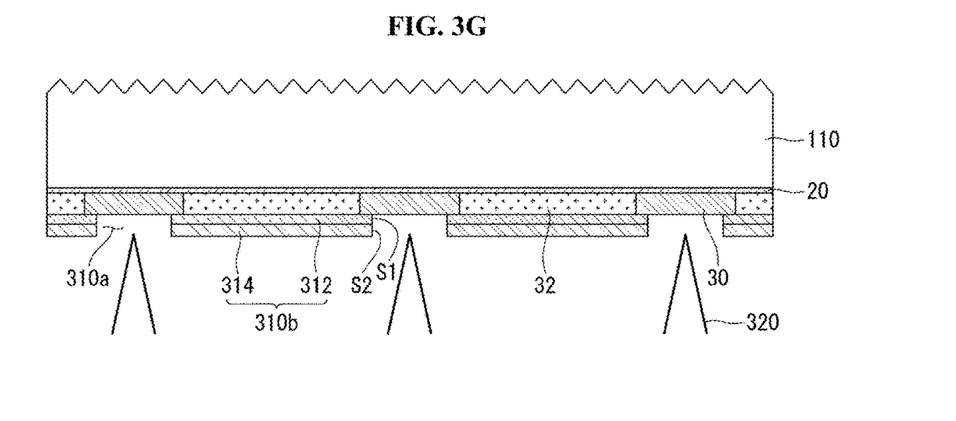

Next, as shown in FIG. 3G, an opening 310a may be formed at the mask layer 310 by a laser patterning using a laser 320 to form a patterned mask layer 310b. More particularly, the laser 320 is irradiated to a portion of the mask layer 310 corresponding to a portion where a second conductive region 34 (see FIG. 3H) is to be positioned, and the corresponding portion is removed to form the opening 310a. Then, a portion of the semiconductor layer 30 which the second conductive region 34 is to be positioned is exposed through the opening 310a.

As described above, since the first layer 312 adjacent to the semiconductor layer 30 has an excellent laser patterning property, the first layer 312 can be easily removed or separated from the semiconductor layer 30 by a laser patterning. In this instance, a portion of the second layer 314 over the portion of the first layer 312 that is removed or separated is also removed, together with the first layer 312. Accordingly, the opening 310a of the patterned mask layer 310b can have a desired pattern by a simple process.

For the laser 320, any of various lasers capable of partially removing the mask layer 310 (particularly, the first layer 312) may be used. For example, the laser 320 may have a wavelength of 1064 nm or less. In one example, the laser 320 may be a green laser having a wavelength of about 532 nm. The green laser can reach the mask layer 310 stably. However, embodiments of the invention are not limited thereto.

As an example, the laser 320 may be a pulsed wave laser having an output for a certain period of time in a pulse waveform and no output for a certain period of time. In this way, sufficient energy is provided to the mask layer 310 in a short period of time to remove the desired portion of the mask layer 310. Thus, the opening 310a can be easily formed. On the other hand, a continuous wave laser having a constant and continuous output, unlike the embodiment, may be difficult to provide sufficient energy suitable for patterning the mask layer 310. However, embodiments of the invention are not limited thereto, and a continuous wave laser may be used.

A pulse width of the laser 320 may be in a degree of femtoseconds (psec) to nanoseconds (nsec). Thus, the energy required for removing the mask layer 310 can be sufficiently provided by the pulse width of the laser 320. However, embodiments of the invention are not limited thereto.

A laser beam size of the laser 320 may be 10 μm and 2 mm. The laser beam size of the laser 320 is limited to a size suitable for forming the opening 310a corresponding to the second conductive region 34 when the laser 320 is applied to the mask layer 310. In this instance, when the laser beam size is small, the opening 310a can be stably formed by irradiating the laser beams so that a part of the laser beams overlap each other. However, embodiments of the invention are not limited to the laser beam size, the method of irradiating the laser beam, or the like.

Figure 3H:
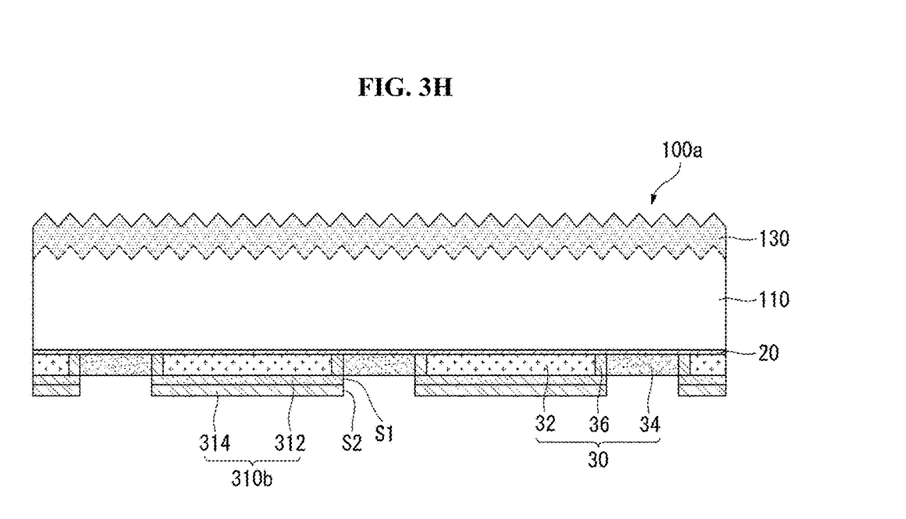
Figure 3I:
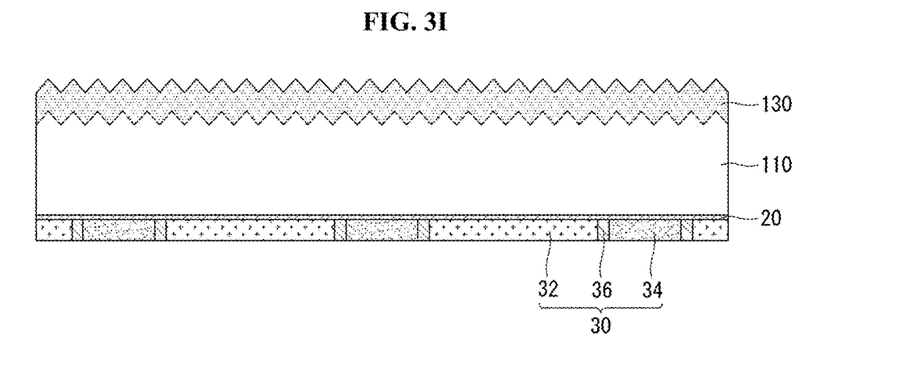
Figure 3J:
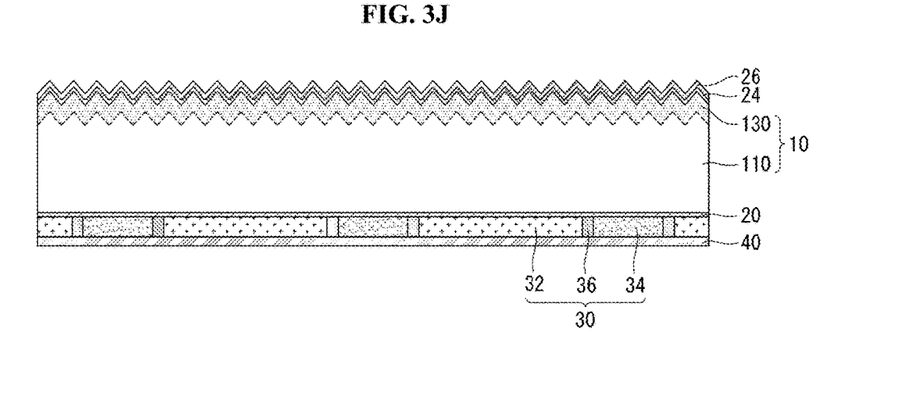
Figure 3K:
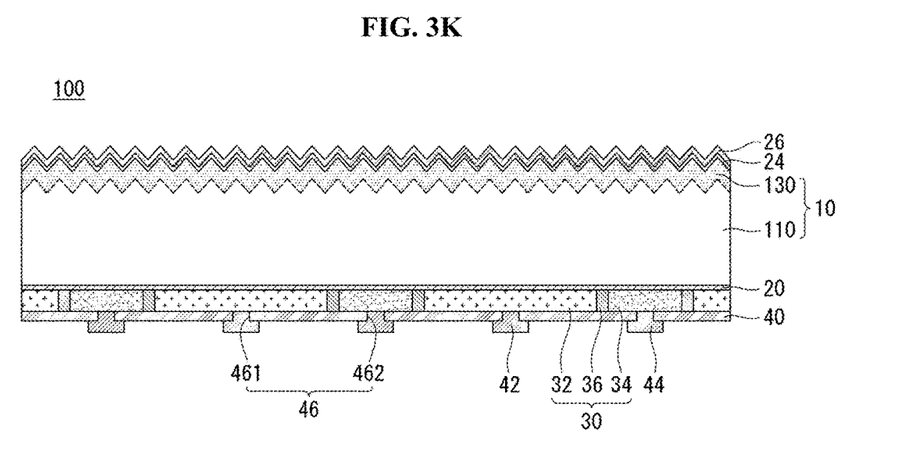

In FIGS. 3A and 3K, it is exemplified that a side surface S1 of the first layer 312 adjacent to the opening 310a and a side surface S2 of the second layer 314 are parallel to each other and are continuous to formed the same surface, and are formed to have a predetermined angle with a surface of the semiconductor layer 30 (for example, to be perpendicular to the surface of the semiconductor layer 30). When the portion of the first layer 312 corresponding to the opening 310a is removed, the corresponding same portion of the second layer 314 is also removed in the same manner. However, embodiments of the invention are not limited thereto, and the side surface S1 of the first layer 312 and the side surface S2 of the second layer 314 may have different shapes. Another example will be described with reference to FIG. 4.

Figure 4:
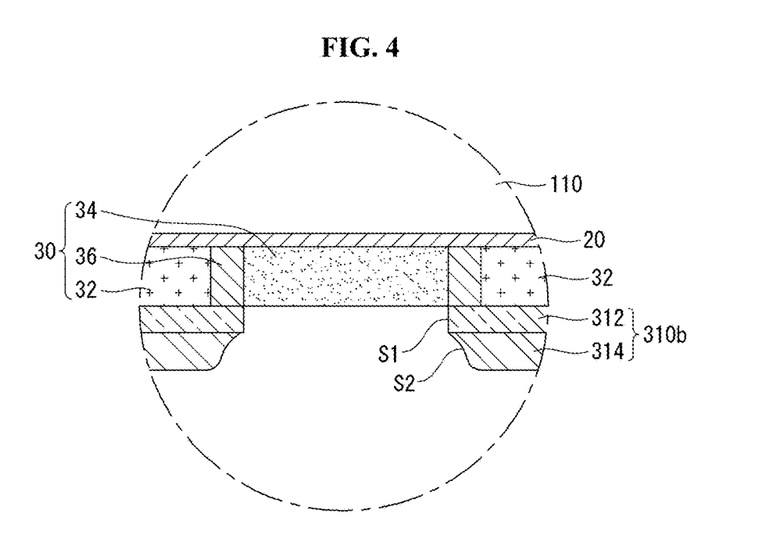
FIG. 4 is a view showing another example of an opening and a patterned mask layer formed by the method for manufacturing the solar cell according to the embodiment of the invention.

FIG. 4 is a view showing another example of an opening and a patterned mask layer formed by the method for manufacturing the solar cell according to the embodiment of the invention. For simplicity and clarity, only a portion where an opening 310a is enlarged and shown in FIG. 4. Referring to FIG. 4, in the modified embodiment, a side surface S1 of a first layer 312 and a side surface S2 of a second layer 314 may have different angles with a surface of the semiconductor layer 30, and may be not positioned on the same plane. For example, the side surface S2 of the second layer 314 is formed so that an area of the opening 310a in the second layer 314 is greater than that in the first layer 312. For example, an area of the opening 310a at the second layer 314 may increase as it goes to an outside away from the semiconductor layer 30. This is because the side surface S1 of the first layer 312, which is directly removed by the laser during the laser patterning, has a relatively large angle with the surface of the semiconductor layer 30 and the second layer 314, which is removed together with the first layer 312, is removed so that the side surface S2 of the second layer 314 may have a relatively small angle with the surface of the semiconductor layer 30. However, embodiments of the invention are not limited thereto. Thus, the side surface S1 of the first layer 312 and the side surface S2 of the second layer 314 may have another shape.

Next, as shown in FIG. 3H, a second conductivity type dopant is doped to form the second conductive region 34 using the patterned mask layer 310b. In this instance, the front surface field region 130 may be formed together.

Any of various methods known as a doping process may be used for forming the second conductive region 34 and the front surface field region 130. For example, various methods, such as, an ion implantation method, a thermal diffusion method by a heat treatment using a gas including a dopant, a heat treatment method performed after forming a doping layer, a laser doping method, or so on may be applied. Embodiments of the invention are not limited thereto. In particular, the second conductive region 34 and the front surface field region 130 may be simultaneously formed by a thermal diffusion method using a gas including a second conductivity type dopant. In this instance, a portion of the semiconductor layer 30 where the patterned mask layer 310b is positioned is prevented from being doped since the patterned mask layer 310b prevents the doping. A portion of the semiconductor layer 30 exposed through the opening 310a is doped with a second conductivity type dopant to form a second conductive region 34. In this instance, the second layer 314 having an excellent dopant barrier property is positioned on an outer surface side of the patterned mask layer 310b, and a diffusion of the dopants can be effectively prevented in the portion where the patterned mask layer 310b is positioned. As described above, the second conductivity type dopant of the second conductive region 34 and the front surface field region 130 may be an n-type dopant (for example, phosphorus). The second layer 314 formed of silicon oxycarbide can effectively prevent the diffusion of the n-type dopant.

In the embodiment, the opening 310b has a width smaller than that of a portion where the first conductive region 32 is not formed, and thus, an undoped region which the dopant is not doped is formed between the first conductive region 32 and the second conductive region 34. Thus, the undoped region in which the dopant is not doped may constitute the barrier region 36.

In the embodiment, it is exemplified that the second conductive region 34 having the conductivity type the same as that of the semiconductor substrate 10 is formed by using the mask layer 310 including the first layer 312 and the second layer 314. In this instance, the second conductive region 34 and the front surface field region 130 having the conductivity type the same as the semiconductor substrate 10 can be formed together using the mask layer 310. However, embodiments of the invention are not limited thereto. The first conductive region 32 having a conductivity type different from that of the semiconductor substrate 10 may be formed using the mask layer 310 including the first layer 312 and the second layer 314. That is, in the embodiment, at least one of the first and second conductive regions 32 and 34 may be formed by using the mask layer 310 including the first layer 312 and the second layer 314.

In the embodiment, it is exemplified that the semiconductor layer 30 is formed, the first conductive region 32 is formed, and the front surface of the semiconductor substrate 10 is textured, and then, the front surface field region 130 and the second conductive region 34 are formed together in the same doping process. However, embodiments of the invention are not limited thereto. Accordingly, a formation order of the first conductive region 32, the second conductive region 34, the front surface field region 130, and the texturing structure may be variously modified.

In another example of the embodiment, the first conductive region 32 may be formed after the second conductive region 34 and/or the front surface field region 130 are formed. Alternatively, the first conductive region 32 may be formed with the second conductive region 34 and/or the front surface field region 130. For example, the semiconductor layer 30 is formed, a dopant layer including a first conductivity type dopant is formed at a region where the first conductive region 32 is to be formed, a mask layer 310 is formed thereon, a following process, such as, a process forming an opening 310a corresponding to the second conductive region 34, is performed, and then, the second conductivity type dopant is diffused by a thermal oxidation process. Then, the first conductivity type dopant included in the dopant layer diffuses into the semiconductor layer 30 corresponding to the portion by the high temperature of the thermal oxidation process to form the first conductive region 32, and the second conductivity type dopant supplied in the thermal oxidation process is diffused into the semiconductor layer 30 through the opening 310a to form the second conductive region 34. On the contrary, the semiconductor layer 30 is formed, a dopant layer including a second conductivity type dopant is formed at a region where the second conductive region 34 is to be formed, a mask layer 310 is formed thereon, a following process, such as, a process forming an opening 310a corresponding to the first conductive region 32, is performed, and then, the first conductivity type dopant is diffused by a thermal oxidation process. The second conductive region 34 and the front surface field region 130 may be formed by different doping processes.

Next, as shown in FIG. 3I, the patterned mask layer 310b is removed. The patterned mask layer 310b may be removed by any of various methods. In one example, the patterned mask layer 310b may be oxidized in the doping process, and the oxidized patterned mask layer 310b may be easily removed by a diluted hydrofluoric acid (DHF).

Next, as shown in FIG. 3J, another insulating layers are formed on the front surface and the back surface of the semiconductor substrate 10. That is, a front passivation layer 24 and an anti-reflection layer 26 are formed on the front surface of the semiconductor substrate 10, and a back passivation layer 40 is formed on the back surface of the semiconductor substrate 10.

More particularly, the front passivation layer 24 and the anti-reflection layer 26 are entirely formed on the front surface of the semiconductor substrate 10, and the back passivation layer 40 is entirely formed on the back surface of the semiconductor substrate 10. The front passivation layer 24, the anti-reflection layer 26, or the back passivation layer 40 may be formed by any of various methods, such as, a vacuum deposition method, a chemical vapor deposition method, a spin coating method, a screen printing method, a spray coating method, or so on. The formation order of the front passivation layer 24, the anti-reflection layer 26, and the back passivation layer 40 is not limited.

Next, as shown in FIG. 3K, first and second electrodes 42 and 44 connected to the first and second conductive regions 32 and 34, respectively, are formed.

In one example, first and second contact holes 461 and 462 are formed at the back passivation layer 40 by a patterning process, and then, the first and second contact holes 461 and 462 are filled to form the first and second electrodes 42 and 44. In this instance, the first and second contact holes 461 and 462 may be formed by a laser ablation method using a laser, various methods using an etching solution or an etching paste, or so on. The first and second electrodes 42 and 44 may be formed by any of various methods, such as, a sputtering method, a plating method, and a deposition method. In particular, in the embodiment, the first and second electrodes 42 and 44 may be formed by a sputtering method.

However, embodiments of the invention are not limited thereto. As another example, pastes for first and second electrodes 42 and 44 may be applied on the back passivation layer 40 by a screen printing method or the like, and then, first and second electrodes 42 and 44 having the above structure may be formed by a fire-through method, a laser firing contact method, or so on. In this instance, since the contact hole 46 is formed when the first and second electrodes 42 and 44 are formed, an additional process for forming the contact hole 46 is not necessary.

According to the embodiment, the mask layer 310 including the first layer 312 and the second layer 314 having different materials or different compositions is used, and thus, the mask layer 310 can perform various roles in a method for manufacturing a solar cell 100. More particularly, the laser patterning property can be improved by the first layer 312, and the semiconductor layer 30 can be stable protected in the texturing process and the doping process and doping can be performed at a desired portion in the doping process by the second layer 314. Further, a manufacturing process time of for the mask layer 310 can be reduced. Thus, productivity of the solar cell 100 having excellent efficiency can be improved.

Hereinafter, the invention will be described in more detail with reference to experimental examples of the invention. However, the experimental examples of the invention are only for exemplifying the invention, and embodiments of the invention are not limited thereto.

Embodiment 1

A control passivation layer including silicon oxide and a semiconductor layer including poly-crystalline silicon were sequentially formed on a back surface of the semiconductor substrate. A mask layer including a first layer having silicon carbide and a second layer having silicon oxycarbide was formed on the semiconductor layer. A front surface of the semiconductor substrate was textured using a potassium hydroxide solution. A laser patterning of the mask layer using a laser was performed to form openings, and the semiconductor layer was doped with a dopant through the openings to form a conductive region to form a photoelectric conversion portion.

Comparative Example 1

A photoelectric conversion portion was formed by the same method as in Embodiment 1 except that a mask layer was formed of a single layer having silicon oxycarbide and did not include a silicon carbide layer. In this instance, a total thickness of the mask layer according to Comparative Example 1 was the same as a total thickness of the mask layer according to Embodiment 1 (i.e., a sum of the thicknesses of the first and second layers).

Comparative Example 2

A photoelectric conversion portion was formed in the same method as in Embodiment 1 except that a mask layer was formed of a single layer containing silicon carbide and did not include a silicon oxycarbide layer. In this instance, a total thickness of the mask layer according to Comparative Example 2 was the same as a total thickness of the mask layer according to Embodiment 1 (i.e., a sum of the thicknesses of the first and second layers).

Figure 5:
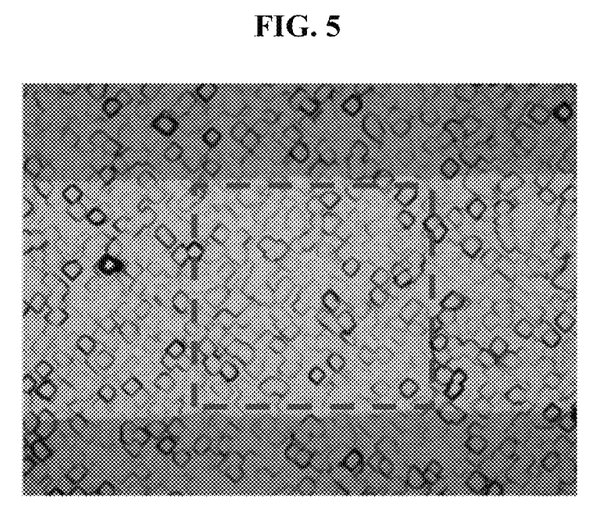
FIG. 5 is a scanning electron microscope (SEM) photograph of a photoelectric conversion portion manufactured according to Embodiment 1.
Figure 6:
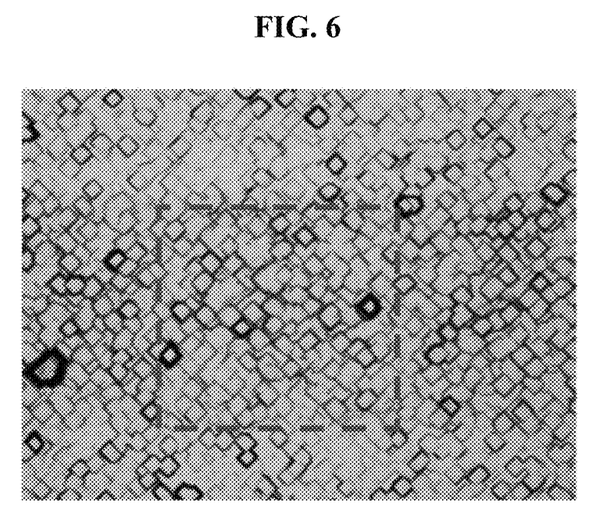
FIG. 6 is a scanning electron microphotograph photograph of a photoelectric conversion portion manufactured according to Comparative Example 1.

A scanning electron microscope (SEM) photograph of a photoelectric conversion portion manufactured according to Embodiment 1 was taken and is shown in FIG. 5, and a scanning electron microscope photograph of a photoelectric conversion portion manufactured according to Comparative Example 1 was taken and is shown in FIG. 6. For reference, in FIGS. 5 and 6, a position of one of laser beams used for forming openings is shown by a dotted line.

Referring to FIG. 5, it can be seen that a portion having a clear brightness difference is provided in Embodiment 1. That is, a portion marked bright in a middle portion of FIG. 5 is a portion where the opening is formed, and portions darkened in upper and lower portions of FIG. 5 are portions where the opening is not formed. It can be seen that the openings marked bright have clear boundaries and thus the openings can be precisely formed and a patterning of the openings can be performed well and smoothly to have a desired shape. On the other hand, referring to FIG. 6, although the laser patterning is performed by irradiating the laser, it can be seen that a portion irradiated with the laser is not bright in Comparative Example 1. From this, it can be seen that the laser patterning is not performed well and smoothly in Comparative Example 1.

Figure 7:
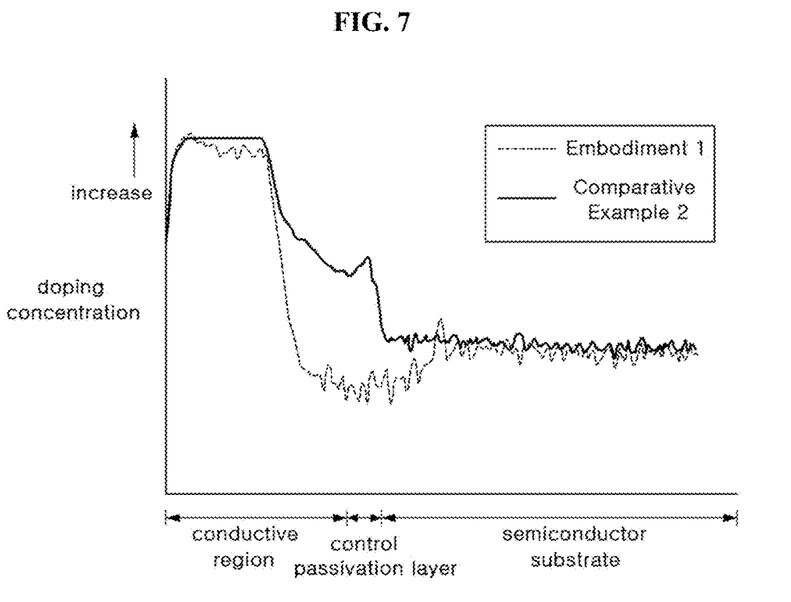
FIG. 7 is a graph showing a result of measuring a doping concentration of the photoelectric conversion portion according to Embodiment 1 and a doping concentration of a photoelectric conversion portion according to Comparative Example 2.

A doping concentration of the photoelectric conversion portion according to Embodiment 1 and a doping concentration of the photoelectric conversion portion according to Comparative Example 2 were measured and the result is shown in FIG. 7.

Referring to FIG. 7, in Embodiment 1, a doping concentration is high at the semiconductor layer, while a doping concentration is low at a vicinity of the semiconductor substrate. On the other hand, in Comparative Example 2, a doping concentration is also high at a vicinity of the semiconductor substrate. From this, it can be seen that the mask layer according to Embodiment 1 has a dopant barrier property superior to that according to Comparative Example 2.

A process time for forming the mask layer according to Embodiment 1 and a process time for forming the mask layer according to Comparative Example 2 were measured. The process time according to Embodiment 1 was set to 100, and the process time according to Comparative Example 2 was calculated as a relative value with the process time according to Embodiment 1 and the results are shown in Table 1. Process conditions such as temperature and gas atmosphere were the same in Embodiment 1 and Comparative Example 2.

TABLE 1

|  | Process Time |
|---|---|
| Embodiment 1 | 100 |
| Comparative Example 2 | 228 |

Referring to Table 1, it can be seen that the process time for forming the mask layer can be effectively reduced according to Embodiment 1. This is because a deposition rate of silicon oxycarbide is greater than that of silicon carbide.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:

1. A method for manufacturing a solar cell, the method comprising:
   forming a semiconductor layer on one surface of a semiconductor substrate;
   forming a mask layer comprising a first layer and a second layer sequentially on the semiconductor layer;
   texturing another surface of the semiconductor substrate using the mask layer as a mask;
   forming a patterned mask layer by forming an opening in the mask layer through a laser patterning using a laser; and
   forming a conductive region through a doping process of doping a portion of the semiconductor layer exposed through the opening with a dopant.

2. The method of claim 1, wherein the first layer comprises a material having a laser patterning property superior to that of the second layer.

3. The method of claim 1, wherein the second layer comprises a material having a chemical resistance property superior to that of the first layer.

4. The method of claim 1, wherein the second layer comprises a material having a dopant barrier property superior to that of the first layer.

5. The method of claim 1, wherein the first layer and the second layer include silicon and carbon, and the first layer and the second layer are formed of different materials or have different compositions from each other.

6. The method of claim 5, wherein the first layer and the second layer are formed by a continuous process in the same apparatus.

7. The method of claim 5, wherein the first layer comprises silicon carbide, and
   wherein the second layer comprises silicon oxycarbide.

8. The method of claim 5, wherein an oxygen content of the second layer is greater than an oxygen content of the first layer.

9. The method of claim 7, wherein a thickness of the second layer is the same as or greater than a thickness of the first layer.

10. The method of claim 9, wherein the first layer has a thickness of 10 to 100 nm, and
    wherein the second layer has a thickness of 90 to 150 nm.

11. The method of claim 7, wherein the first layer has a refractive index of 1.6 to 1.8, and wherein the second layer has a refractive index of 1.5 to 1.7.

12. The method of claim 1, wherein each of the first layer and the second layer are formed by a vapor deposition method,
wherein a deposition rate of the second layer is greater than a deposition rate of the first layer, and
wherein a thickness of the second layer is the same as or greater than a thickness of the first layer.

13. The method of claim 1, wherein the mask layer is entirely formed on the semiconductor layer in the forming of the mask layer.

14. The method of claim 1, wherein the texturing is performed by a wet texturing using an alkali solution.

15. The method of claim 1, wherein the laser is at least one of the group of a green laser and a pulsed laser.

16. The method of claim 1, wherein the dopant used in the doping process has a conductivity type the same as that of a main dopant included in the semiconductor substrate, and
wherein the dopant is doped to the other surface of the semiconductor substrate together in the doping process to simultaneously form an surface field region and the conductive region.

17. The method of claim 1, further comprising:
another doping process of doping the semiconductor layer with another dopant having a conductivity type opposite to that of the dopant used in the doping process to form another conductive region.

18. The method of claim 17, wherein the another conductive region is formed by a manufacturing process different from that of the conductive region.

19. The method of claim 1, further comprising:
forming a control passivation layer on the one surface of the semiconductor substrate where the semiconductor layer is to be formed, before the forming of the semiconductor layer,
wherein, in the forming of the semiconductor layer, the semiconductor layer is formed on the control passivation layer.

20. The method of claim 1, wherein the semiconductor layer comprises an amorphous, micro-crystalline, or poly-crystalline semiconductor.

* * * * *